United States Patent
Kawamura et al.

(10) Patent No.: US 10,916,644 B2
(45) Date of Patent: Feb. 9, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Keiko Kawamura, Yokohama Kanagawa (JP); Tsuneo Ogura, Kamakura Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 19 days.

(21) Appl. No.: 16/241,106

(22) Filed: Jan. 7, 2019

(65) Prior Publication Data
US 2020/0091324 A1  Mar. 19, 2020

(30) Foreign Application Priority Data
Sep. 14, 2018 (JP) .................. 2018-172650

(51) Int. Cl.
*H01L 29/739* (2006.01)
*H01L 29/10* (2006.01)
*H01L 29/868* (2006.01)
*H01L 29/417* (2006.01)

(52) U.S. Cl.
CPC ...... *H01L 29/7397* (2013.01); *H01L 29/1095* (2013.01); *H01L 29/41708* (2013.01); *H01L 29/868* (2013.01)

(58) Field of Classification Search
CPC combination set(s) only.
See application file for complete search history.

(56) References Cited

U.S. PATENT DOCUMENTS

2014/0167201 A1* 6/2014 Arai .................. H01L 29/08
257/471

FOREIGN PATENT DOCUMENTS

| JP | H11-274521 A | 10/1999 |
|----|--------------|---------|
| JP | 2006-339508 A | 12/2006 |
| JP | 2009-224485 A | 10/2009 |
| JP | 2010-147399 A | 7/2010 |
| JP | 2014-120685 A | 6/2014 |

* cited by examiner

*Primary Examiner* — Ratisha Mehta
(74) *Attorney, Agent, or Firm* — White & Case LLP

(57) ABSTRACT

A semiconductor device includes a first electrode, a second electrode disposed at a position opposing the first electrode, and a semiconductor body provided between the first electrode and the second electrode. The semiconductor body includes a first semiconductor layer of a first conductivity type, a second semiconductor layer of a second conductivity type and a third semiconductor layer of the second conductivity type; the second semiconductor layer is provided between the first semiconductor layer and the first electrode; and the third semiconductor layer is selectively provided inside the first semiconductor layer and disposed at a position separated from the second semiconductor layer. The first electrode is electrically connected to the second semiconductor layer and includes an extension portion; and the extension portion pierces the second semiconductor layer, extends in a first direction toward the second electrode, and is connected to the third semiconductor layer.

6 Claims, 10 Drawing Sheets

SEMICONDUCTOR DEVICE

CROSS-REFERENCE TO RELATED APPLICATIONS

This application is based upon and claims the benefit of priority from Japanese Patent Application No. 2018-172650, filed on Sep. 14, 2018; the entire contents of which are incorporated herein by reference.

FIELD

Embodiments relate to a semiconductor device.

BACKGROUND

It is desirable to reduce the ON-voltage and the switching loss of a power control semiconductor device. The ON-voltage can be reduced by increasing the carrier concentration in the semiconductor. On the other hand, the switching loss is reduced by shortening the time to remove the carriers inside the semiconductor through the electrodes when turning-off the semiconductor device. Accordingly, it is difficult to reduce both the ON-voltage and the switching loss.

DETAILED DESCRIPTION

Figure 1:
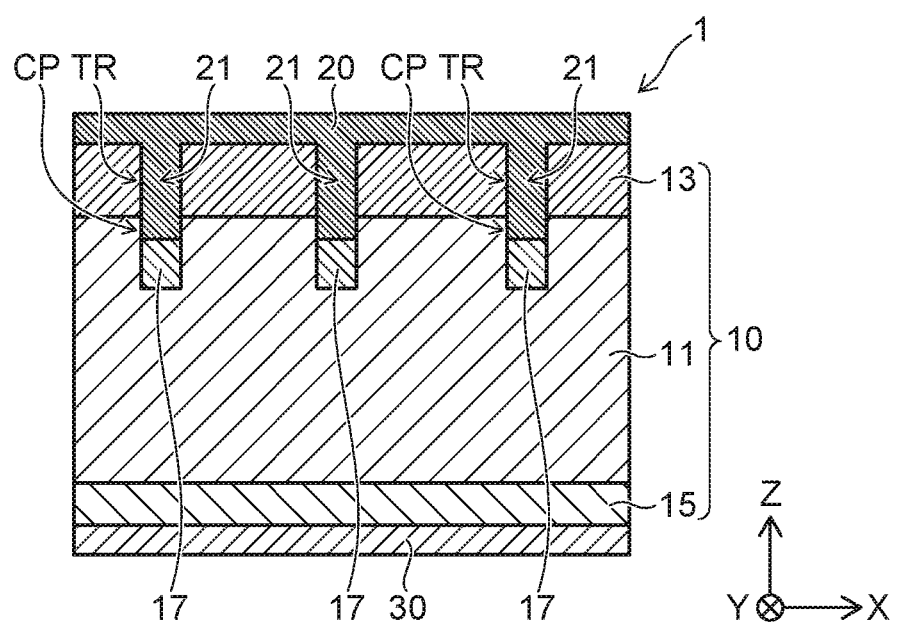
FIG. 1 is a schematic cross-sectional view showing a semiconductor device according to a first embodiment.

According to one embodiment, a semiconductor device includes a first electrode, a second electrode disposed at a position opposing the first electrode, and a semiconductor body provided between the first electrode and the second electrode; and the semiconductor body includes a first semiconductor layer of a first conductivity type. The semiconductor body further includes a second semiconductor layer of a second conductivity type and a third semiconductor layer of the second conductivity type; the second semiconductor layer is provided between the first semiconductor layer and the first electrode; and the third semiconductor layer is selectively provided inside the first semiconductor layer and disposed at a position separated from the second semiconductor layer. The first electrode is electrically connected to the second semiconductor layer and includes an extension portion; and the extension portion pierces the second semiconductor layer, extends in a first direction toward the second electrode, and is connected to the third semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment. The semiconductor device 1 is, for example, a PIN diode and is included in a power converter or the like and used with an IGBT (Insulated Gate Bipolar Transistor), a MOSFET (Metal Oxide Semiconductor Field Effect Transistor), etc.

As shown in FIG. 1, the semiconductor device 1 includes a semiconductor body 10, an anode electrode 20, and a cathode electrode 30. The semiconductor device 1 is a vertical element; and the cathode electrode 30 is disposed at a position opposing the anode electrode 20. The semiconductor body 10 is provided between the anode electrode 20 and the cathode electrode 30.

The semiconductor body 10 includes an n-type semiconductor layer 11, a p-type anode layer 13, an n-type cathode layer 15, and a p-type semiconductor layer 17. The p-type anode layer 13 is provided between the n-type semiconductor layer 11 and the anode electrode 20. The n-type cathode layer 15 is provided between the n-type semiconductor layer 11 and the cathode electrode 30.

The p-type semiconductor layer 17 is selectively provided inside the n-type semiconductor layer 11. The p-type semiconductor layer 17 is disposed at a position separated from the p-type anode layer 13.

The anode electrode 20 is electrically connected to the p-type anode layer 13. Also, the cathode electrode 30 is electrically connected to the n-type cathode layer 15. Here, "electrically connected" means both the case of direct contact and the case of contact via another conductive layer. This is similar for the description recited below as well.

The anode electrode 20 includes an extension portion 21 piercing the p-type anode layer 13 and extending in a direction (i.e., the reverse direction of the Z-direction, i.e., the −Z direction hereinbelow) toward the cathode electrode 30. The extension portion 21 is provided to be connected to the p-type semiconductor layer 17. Also, the extension portion 21 includes a contact portion CP positioned between the p-type anode layer 13 and the p-type semiconductor layer 17. The contact portion CP contacts the n-type semiconductor layer 11.

The n-type semiconductor layer 11 and the n-type cathode layer 15 are, for example, n-type silicon layers. The n-type cathode layer 15 includes an n-type impurity having a higher concentration than the n-type impurity included in the n-type semiconductor layer 11. The n-type cathode layer 15 may be provided as one body with the n-type semiconductor layer 11. In other words, for example, a high concentration of the n-type impurity may be introduced to the backside of the n-type semiconductor layer 11 by using ion implantation. For example, the p-type anode layer 13 is formed by ion implantation of a p-type impurity into the n-type semiconductor layer 11.

The extension portion 21 of the anode electrode 20 is formed by filling a metal layer into the interior of a trench TR having a depth piercing the p-type anode layer 13. The extension portion 21 includes a metal having a Schottky contact with the n-type semiconductor layer 11 for at least the portion contacting the n-type semiconductor layer 11, The extension portion 21 may be formed of the same material as the main body of the anode electrode 20, or may be formed using a different material. For example, the extension portion 21 includes at least one of aluminum (Al), tantalum (Ta), silver (Ag), molybdenum (Mo), tungsten (W), cobalt (Co), chrome (Cr), ruthenium (Ru), gold (Au), palladium (Pd), nickel (Ni), or platinum (Pt) in at least the portion contacting the n-type semiconductor layer 11.

For example, the p-type semiconductor layer 17 is formed by ion implantation of the p-type impurity into the bottom surface of the trench TR. The p-type semiconductor layer 17 may be formed simultaneously with the p-type anode layer 13 or may be formed in another process. For example, the p-type semiconductor layer 17 is provided to contact the metal layer (i.e., the extension portion 21) filled into the trench TR.

Figure 2A:
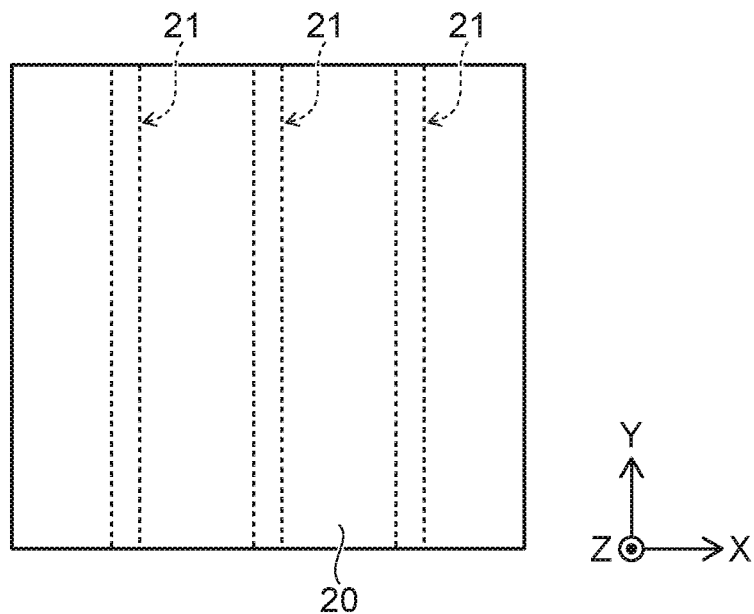
FIGS. 2A and 2B are schematic plan views showing the semiconductor device according to the first embodiment.
Figure 2B:
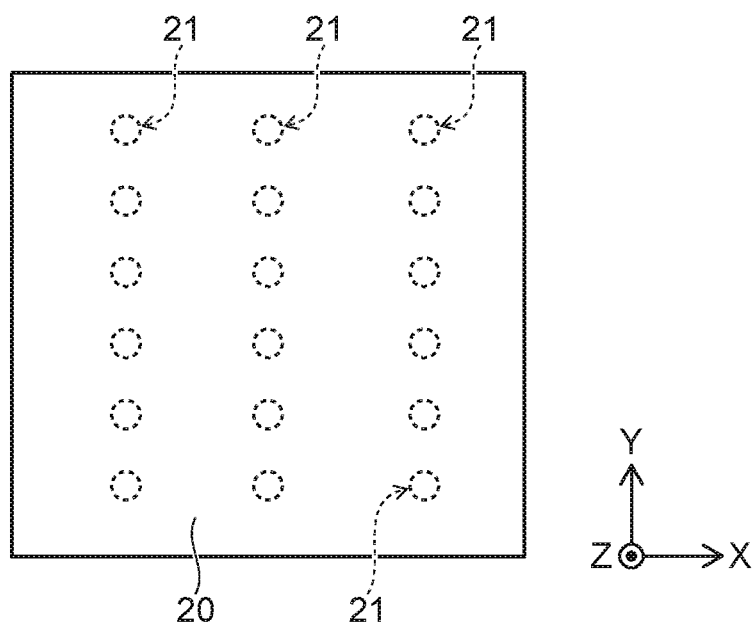

FIGS. 2A and 2B are schematic plan views showing the semiconductor device 1 according to the first embodiment. For example, FIGS. 2A and 2B illustrate the upper surface of the semiconductor device 1 and show arrangements of the extension portions 21 in the X-Y plane. The arrangements of the extension portions 21 shown here are examples; and the embodiments are not limited thereto.

As shown in FIG. 2A, the extension portions 21 of the anode electrode 20 extend in the Y-direction. Also, the extension portions 21 are multiply provided and are arranged in the X-direction.

As shown in FIG. 2B, for example, the extension portions 21 may be provided in circular columnar configurations. For example, the multiple extension portions 21 are arranged in the X-direction and the Y-direction and are arranged to be separated from each other.

Figure 3A:
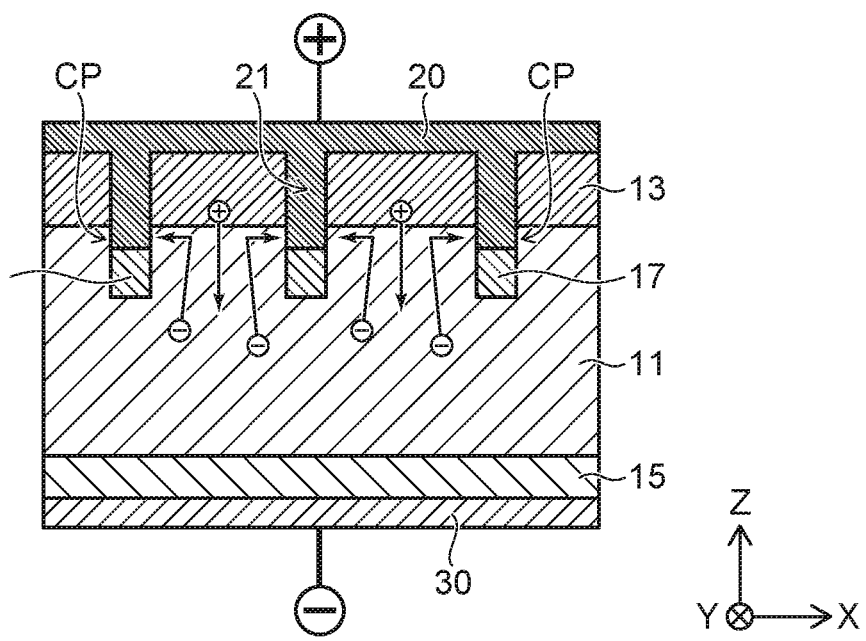
FIGS. 3A and 3B are schematic views showing carrier flows in the semiconductor device according to the first embodiment.
Figure 3B:
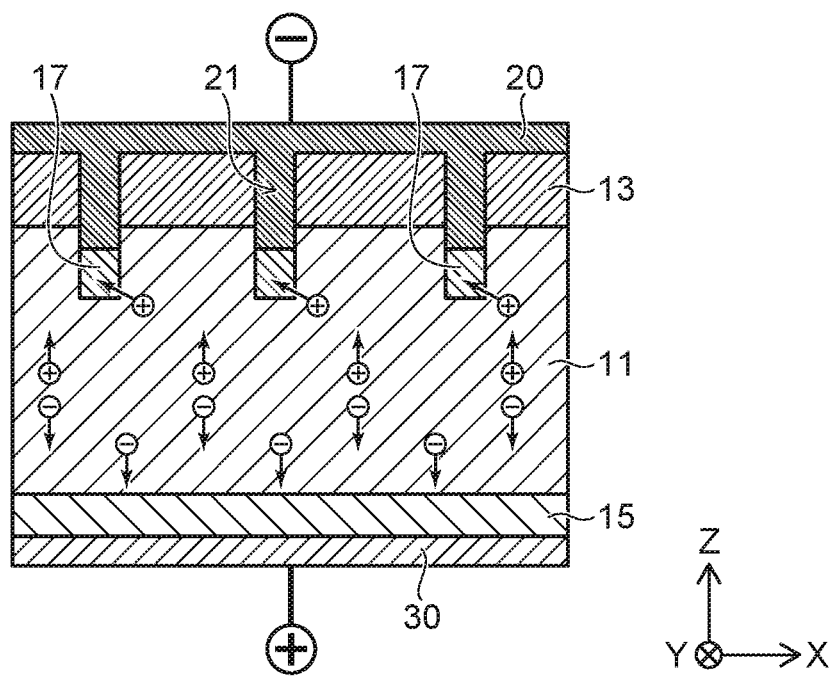

FIGS. 3A and 3B are schematic views showing the flow of carriers in the n-type semiconductor layer 11 of the semiconductor device 1 according to the first embodiment. FIG. 3A illustrates the case where the semiconductor device 1 is biased in the forward direction (the ON-state). FIG. 3B illustrates the flow of the carriers in the transition interval of switching the bias of the semiconductor device 1 from the forward direction to the reverse direction (the OFF-state).

In the ON-state shown in FIG. 3A, electrons inside the n-type semiconductor layer 11 flow in the direction of the p-type anode layer 13. On the other hand, holes are injected from the p-type anode layer 13 into the n-type semiconductor layer 11; and the amount of the electrons and the amount of the holes are balanced inside the n-type semiconductor layer 11.

For example, the path of the electrons flowing from the n-type semiconductor layer 11 to the anode electrode 20 includes the route through the p-n junction between the n-type semiconductor layer 11 and the p-type anode layer 13, and the route through the contact portion CP of the extension portion 21 of the anode electrode 20. Also, the potential that obstructs the flow of the electrons is lower for the route through the Schottky junction of the contact portion CP than for the route through the p-n junction. Accordingly, the electrons inside the n-type semiconductor layer 11 flow to the anode electrode 20 mainly via the contact portion CP.

FIG. 3B illustrates the flow of the carriers in the transition interval from the ON-state to the OFF-state. The electrons inside the n-type semiconductor layer 11 are discharged to the cathode electrode 30 via the n-type cathode layer 15. On the other hand, the discharge path of the holes includes the route of being discharged to the anode electrode 20 via the p-type anode layer 13, and the route of being discharged to the anode electrode 20 via the extension portion 21 and the p-type semiconductor layer 17 positioned inside the n-type semiconductor layer 11. In the example, many of the holes inside the n-type semiconductor layer 11 are discharged via the p-type semiconductor layer 17 and the extension portion 21.

In the ON-state of the semiconductor device 1, the electrons inside the n-type semiconductor layer 11 flow to the anode electrode 20 through the contact portion CP of the extension portion 21. Therefore, compared to a structure not including the extension portion 21, the electrons flow to the anode electrode 20 quickly. Accordingly, the electron amount inside the n-type semiconductor layer 11 is reduced; and the amount of the holes balancing the electron amount also is reduced. In other words, in the semiconductor device 1, the carrier amount inside the n-type semiconductor layer 11 in the ON-state is reduced.

On the other hand, in the transition interval to the OFF-state, the holes inside the n-type semiconductor layer 11 are discharged to the anode electrode 20 via the p-type semiconductor layer 17. Therefore, compared to a structure in which the p-type semiconductor layer 17 is not provided, the holes are discharged to the anode electrode 20 quickly.

For example, the length of the transition interval from the ON-state to the OFF-state is dependent on the discharge time of the holes. Accordingly, in the semiconductor device 1, the discharge of the holes is promoted by providing the p-type semiconductor layer 17; and the transition interval is shortened. Further, in the semiconductor device 1, the carrier amount inside the n-type semiconductor layer 11 in the ON-state can be reduced. Thereby, the time necessary for the discharge of the carriers can be shortened further. As a result, the transition interval for discharging the carriers from the n-type semiconductor layer 11 can be shortened; and the switching loss can be reduced.

Figure 4:
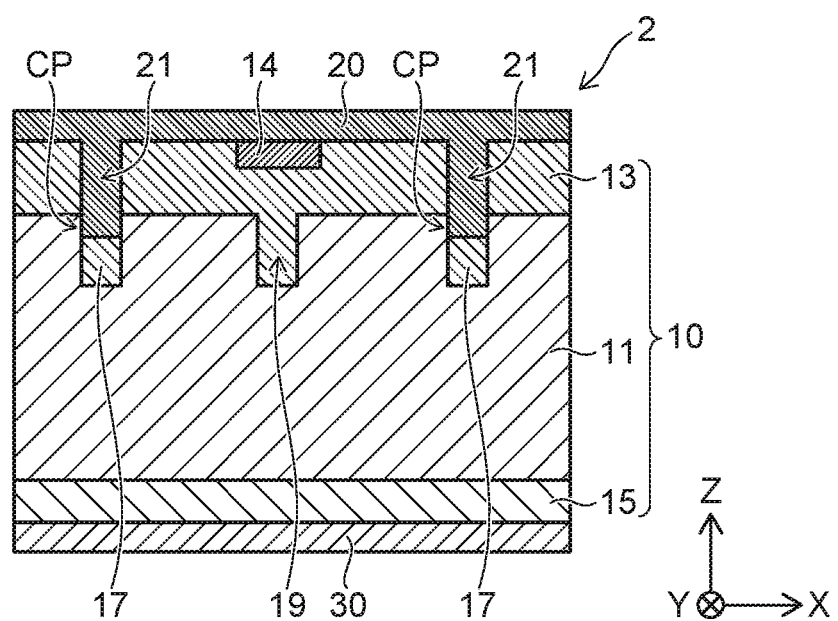
FIG. 4 is a schematic cross-sectional view showing a semiconductor device according to a modification of the first embodiment.

FIG. 4 is a schematic cross-sectional view showing a semiconductor device 2 according to a modification of the first embodiment. In the semiconductor device 2, for example, the p-type anode layer 13 includes a protrusion 19 provided between the extension portions 21 adjacent to each other in the X-direction.

The protrusion 19 includes the p-type impurity having a higher concentration than the n-type impurity of the n-type semiconductor layer 11 and extends in a direction (the −Z direction) from the p-type anode layer 13 toward the cathode electrode 30. For example, the tip of the protrusion 19 is formed to be positioned at substantially the same level as the level of the lower end of the p-type semiconductor layer 17 in the Z-direction.

A p$^+$-type contact layer 14 may be further provided between the protrusion 19 and the anode electrode 20. The p$^+$-type contact layer 14 is selectively provided between the p-type anode layer 13 and the anode electrode 20 and includes the p-type impurity having a higher concentration than the p-type impurity of the p-type anode layer 13. The p$^+$-type contact layer 14 is electrically connected to the anode electrode 20.

Figure 5A:
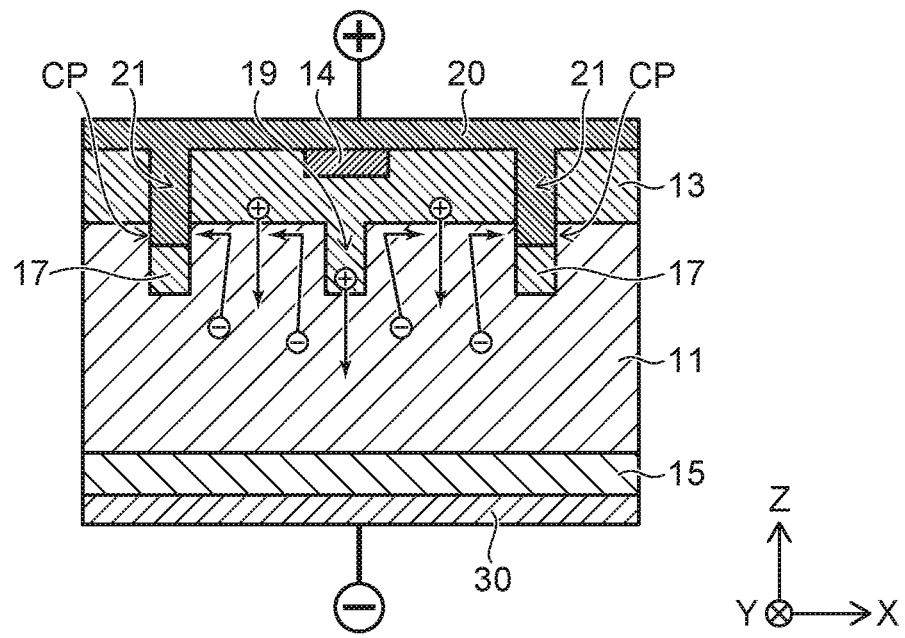
FIGS. 5A and 5B are schematic views showing carrier flows in the semiconductor device according to the modification of the first embodiment.
Figure 5B:
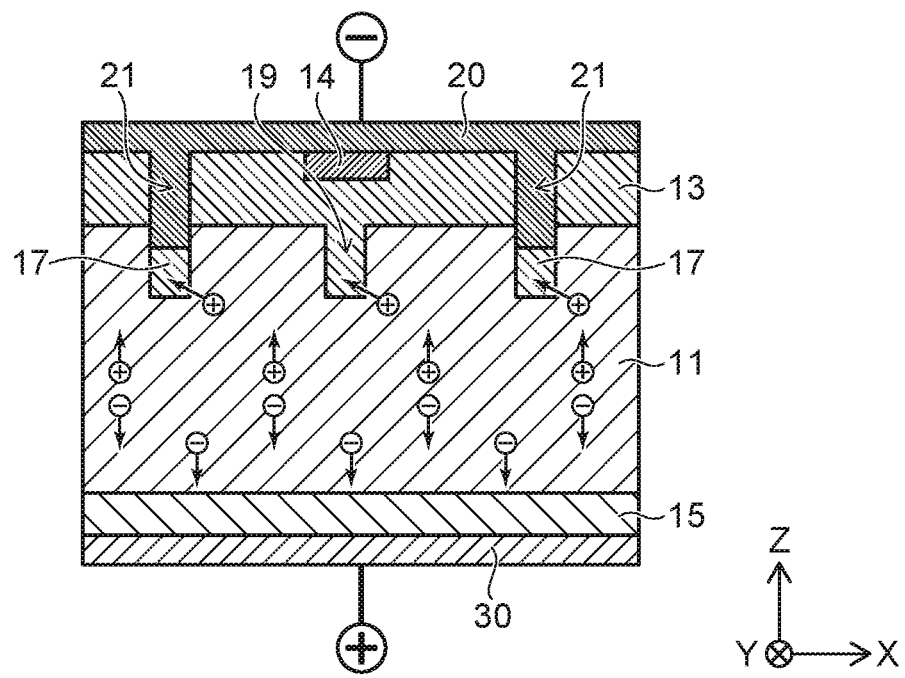

FIGS. 5A and 5B are schematic views showing the flow of the carriers in the n-type semiconductor layer 11 of the semiconductor device 2 according to the modification of the first embodiment. FIG. 5A illustrates the case where the semiconductor device 2 is biased in the forward direction (the ON-state). FIG. 5B illustrates the flow of the carriers in the transition interval of switching the bias of the semiconductor device 2 from the forward direction to the reverse direction (the OFF-state). In the semiconductor device 2, for example, the spacing in the X-direction of the extension portions 21 of the anode electrode 20 is set to be wider than the spacing in the X-direction of the extension portions 21 of the semiconductor device 1 shown in FIG. 1.

In the ON-state shown in FIG. 5A, the electrons inside the n-type semiconductor layer 11 flow to the anode electrode 20 mainly via the contact portion CP of the extension portion 21. Because the spacing in the X-direction of the extension portions 21 is wide in the example, fewer electrons flow to the anode electrode 20 via the contact portion CP compared to the semiconductor device 1. As a result, the amount of the electrons inside the n-type semiconductor layer 11 increases; and the amount of the holes injected from the p-type anode layer 13 to balance the amount of the electrons also increases.

FIG. 5B illustrates the flow of the carriers in the transition interval from the ON-state to the OFF-state. The holes inside the n-type semiconductor layer 11 are discharged to the anode electrode 20 through the p-type semiconductor layer 17 and the extension portion 21 and are discharged to the anode electrode 20 through the protrusion 19 of the p-type anode layer 13. At this time, because the p$^+$-type contact layer 14 is provided, the movement of the holes from the p-type anode layer 13 to the anode electrode 20 is smooth. Thereby, the avalanche resistance can be improved.

In the ON-state in the semiconductor device 2, the ON-voltage can be reduced compared to that of the semiconductor device 1 because the carrier amount inside the n-type semiconductor layer 11 is increased. In other words, compared to the semiconductor device 1, the switching loss increases; but the ON-voltage can be reduced.

In the embodiment, for example, the ON-voltage and the switching loss can be controlled by changing the spacing in the X-direction of the extension portions 21 of the anode electrode 20. For example, the switching loss can be reduced by setting the spacing in the X-direction of the extension portions 21 to be narrow. On the other hand, the ON-voltage is reduced by setting the spacing in the X-direction of the extension portions 21 to be wide. Therefore, the desired ON-voltage and switching characteristics can be realized by appropriately adjusting the spacing in the X-direction of the extension portions 21.

At turn-off in the semiconductor devices 1 and 2, the holes are discharged rapidly from the n-type semiconductor layer 11 through the p-type semiconductor layer 17 and the extension portion 21. Therefore, in the semiconductor devices 1 and 2, the avalanche resistance can be improved compared to a structure in which the extension portion 21 is not provided. On the other hand, the avalanche resistance of the semiconductor device 1 is dependent on the spacing in the X-direction of the extension portions 21; and the avalanche resistance decreases as the spacing in the X-direction of the extension portions 21 widens. Therefore, in the semiconductor device 2, by providing the protrusion 19 of the p-type anode layer 13 between the extension portions 21 adjacent to each other in the X-direction, the discharge of the holes can be promoted; and the decrease of the avalanche resistance can be prevented.

Figure 6:
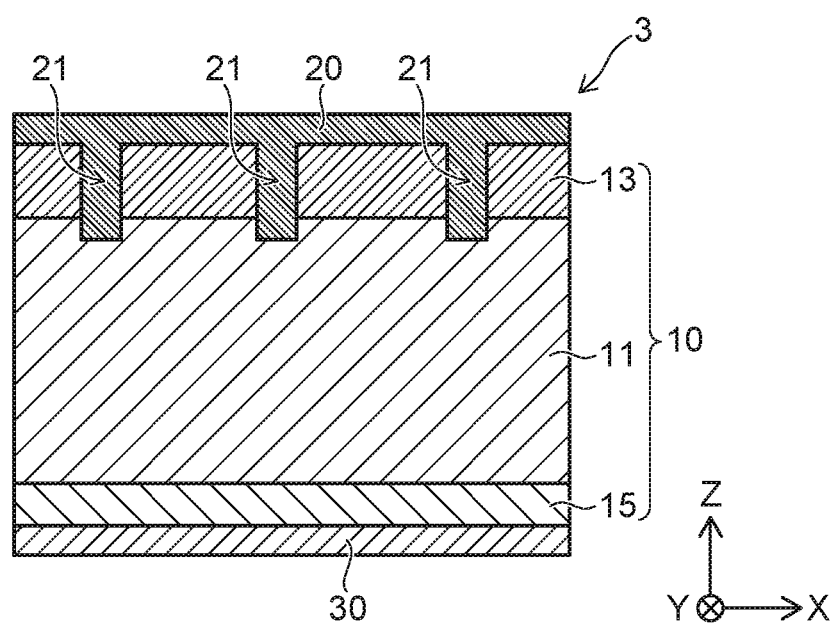
FIG. 6 is a schematic cross-sectional view showing a semiconductor device according to another modification of the first embodiment.

FIG. 6 is a schematic cross-sectional view showing a semiconductor device 3 according to another modification of the first embodiment. In the semiconductor device 3, the p-type semiconductor layer 17 is not provided in the interior of the n-type semiconductor layer 11. In other words, the end of the extension portion 21 of the anode electrode 20 is positioned inside the n-type semiconductor layer 11. Also, the portion of the extension portion 21 positioned inside the n-type semiconductor layer 11 has a Schottky contact with the n-type semiconductor layer 11.

Figure 7A:
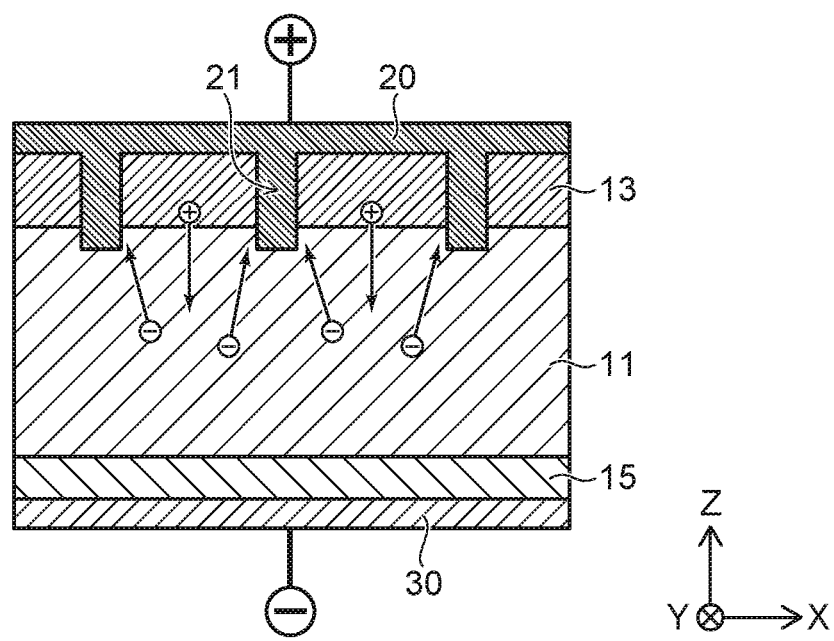
FIGS. 7A and 7B are schematic views showing carrier flows in the semiconductor device according to another modification of the first embodiment.
Figure 7B:
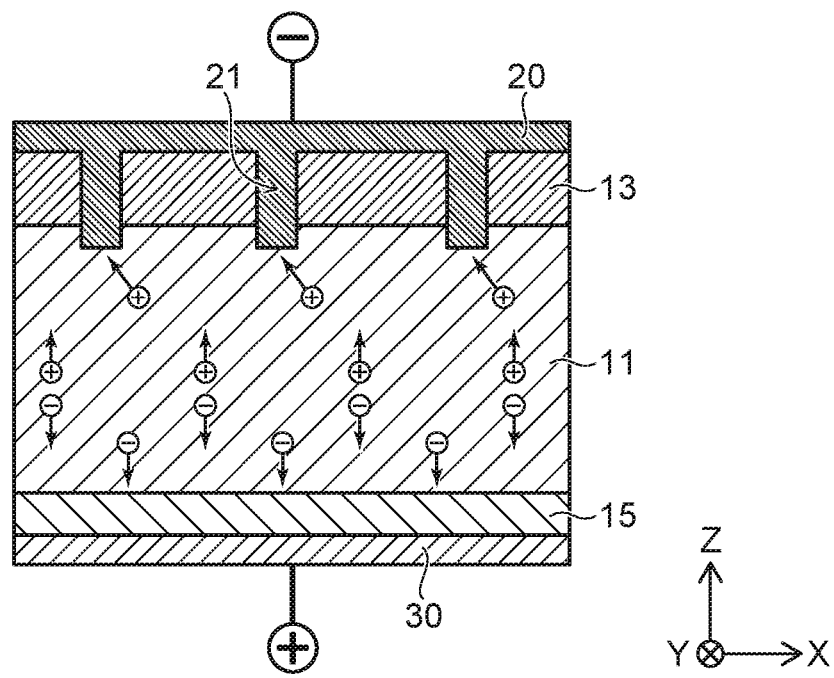

FIGS. 7A and 7B are schematic views showing the flow of the carriers in the n-type semiconductor layer 11 of the semiconductor device 3. FIG. 7A illustrates the case where the semiconductor device 3 is biased in the forward direction (the ON-state). FIG. 7B illustrates the flow of the carriers in the transition interval of switching the bias of the semiconductor device 2 from the forward direction to the reverse direction (the OFF-state).

In the ON-state shown in FIG. 7A, the electrons inside the n-type semiconductor layer 11 flow to the anode electrode 20 mainly via the extension portion 21. The electrons inside the n-type semiconductor layer 11 flow efficiently to the anode electrode 20 via the extension portion 21. Therefore, the amount of the electrons inside the n-type semiconductor layer 11 decreases; and the amount of the holes injected from the p-type anode layer 13 to balance the amount of the electrons also decreases.

FIG. 7B illustrates the flow of the carriers in the transition interval from the ON-state to the OFF-state. The holes inside the n-type semiconductor layer 11 are discharged to the anode electrode 20 rapidly through the extension portion 21.

In the semiconductor device 3, the carrier amount inside the n-type semiconductor layer 11 is reduced; and the holes inside the n-type semiconductor layer 11 are discharged to the anode electrode 20 rapidly through the extension portion 21. Therefore, the transition interval at turn-off from the ON-state to the OFF-state can be shortened; and the switching loss can be reduced further.

Second Embodiment

Figure 8:
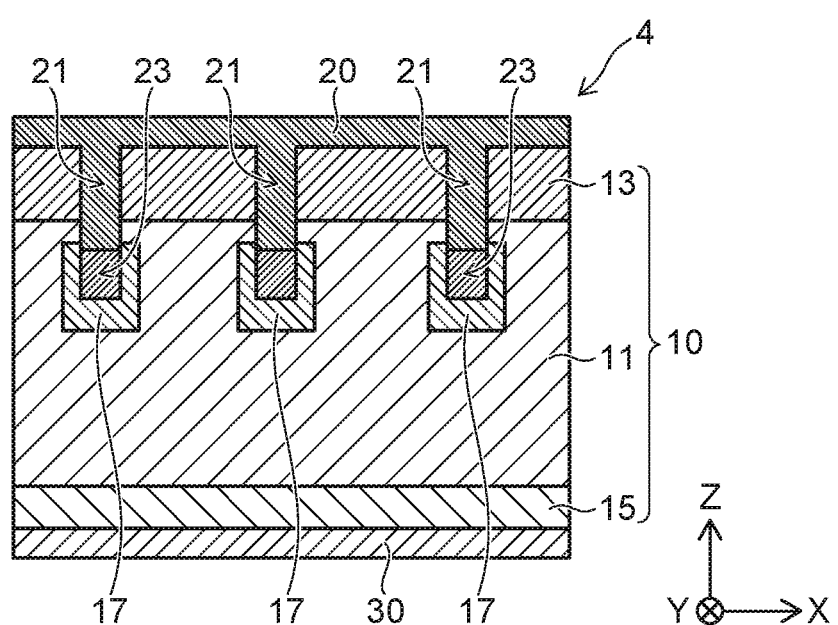
FIG. 8 is a schematic cross-sectional view showing a semiconductor device according to a second embodiment.

FIG. 8 is a schematic cross-sectional view showing a semiconductor device 4 according to a second embodiment. As shown in FIG. 8, the semiconductor device 4 includes a metal layer 23 positioned inside the p-type semiconductor layer 17. The metal layer 23 is provided to be connected to the extension portion 21 of the anode electrode 20. For example, the metal layer 23 is provided not to contact the n-type semiconductor layer 11.

The metal layer 23 is provided to have a Schottky contact with the p-type semiconductor layer 17. For example, the metal layer 23 includes a metal in at least the portion contacting the p-type semiconductor layer 17; and the metal has a work function smaller than the work function of the metal included in the portion of the extension portion 21 contacting the n-type semiconductor layer 11. For example, the metal layer 23 includes at least one of titanium (Ti), tantalum (Ta), or molybdenum (Mo) in at least the portion contacting the p-type semiconductor layer 17.

Figure 9A:
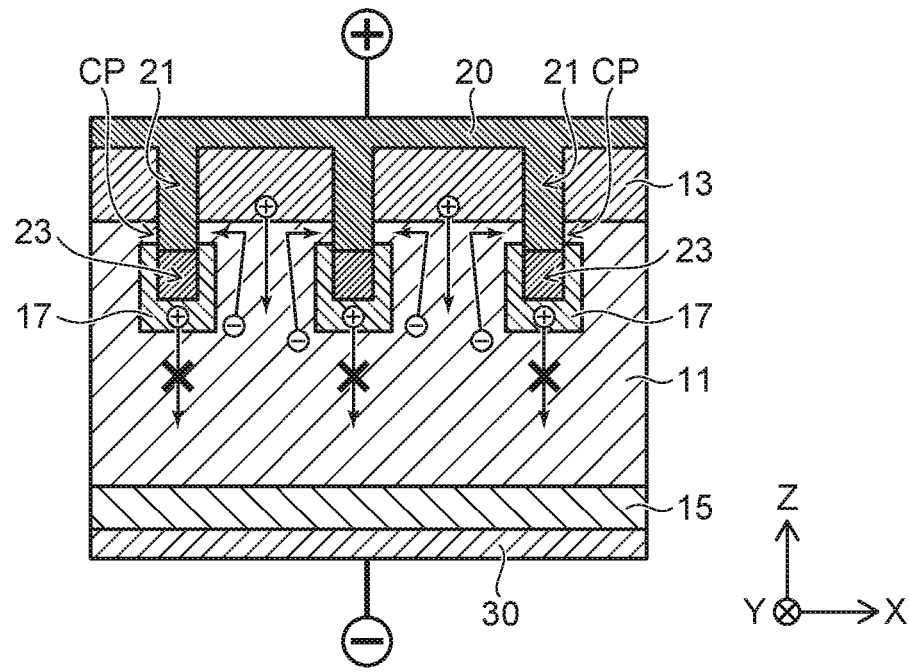
FIGS. 9A and 9B are schematic views showing carrier flows in the semiconductor device according to the second embodiment.
Figure 9B:
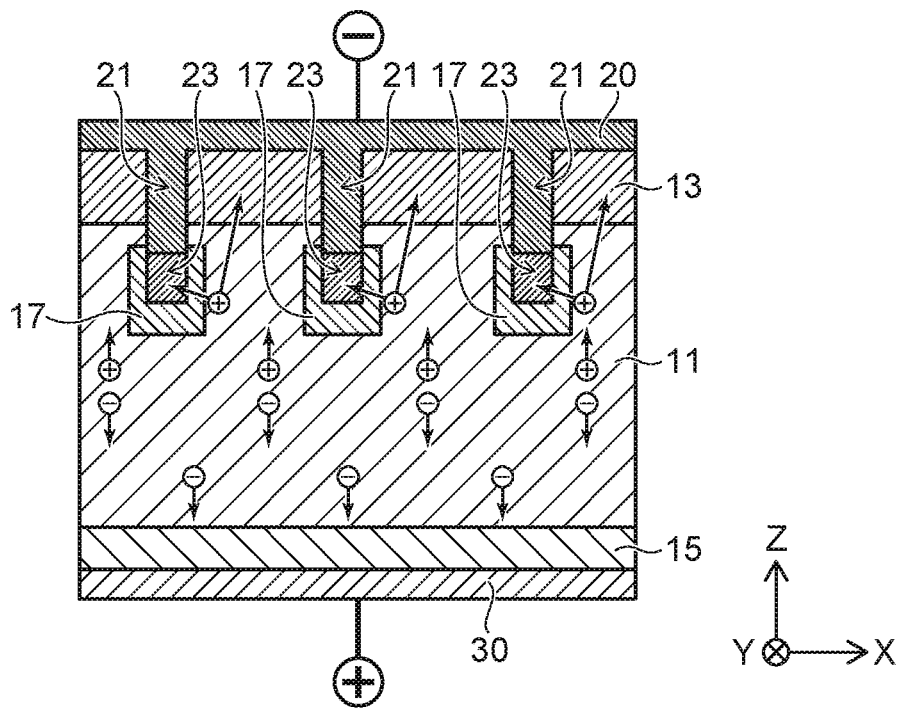

FIGS. 9A and 9B are schematic views showing the flow of the carriers in the n-type semiconductor layer 11 of the semiconductor device 4 according to the second embodiment. FIG. 9A illustrates the case where the semiconductor device 4 is biased in the forward direction (the ON-state). FIG. 9B illustrates the flow of the carriers in the transition interval of switching the bias of the semiconductor device 4 from the forward direction to the reverse direction (the OFF-state).

In the ON-state shown in FIG. 9A, the electrons inside the n-type semiconductor layer 11 flow to the anode electrode 20 through the contact portion CP of the extension portion 21. Therefore, the electron amount inside the n-type semiconductor layer 11 can be reduced. Accordingly, the amount of the holes injected from the p-type anode layer 13 into the n-type semiconductor layer 11 also is reduced. Further, the hole injection from the p-type semiconductor layer 17 into the n-type semiconductor layer 11 is suppressed by the Schottky junction formed between the metal layer 23 and the p-type semiconductor layer 17.

FIG. 9B illustrates the flow of the carriers in the transition interval from the ON-state to the OFF-state. The holes inside the n-type semiconductor layer 11 are discharged to the anode electrode 20 mainly via the p-type anode layer 13. The amount of the holes discharged to the anode electrode 20 through the p-type semiconductor layer 17 is reduced by the metal layer 23. Also, the electrons inside the n-type semiconductor layer 11 are discharged to the cathode electrode 30 via the n-type cathode layer 15.

In the ON-state in the semiconductor device 4, by reducing the carrier amount inside the n-type semiconductor layer 11, the switching loss in the transition interval of transitioning from the ON-state to the OFF-state can be reduced. Also, by suppressing the hole injection from the p-type semiconductor layer 17 into the n-type semiconductor layer 11, the current concentration can be avoided; and the breakdown voltage of the semiconductor device 4 can be increased.

Third Embodiment

Figure 10:
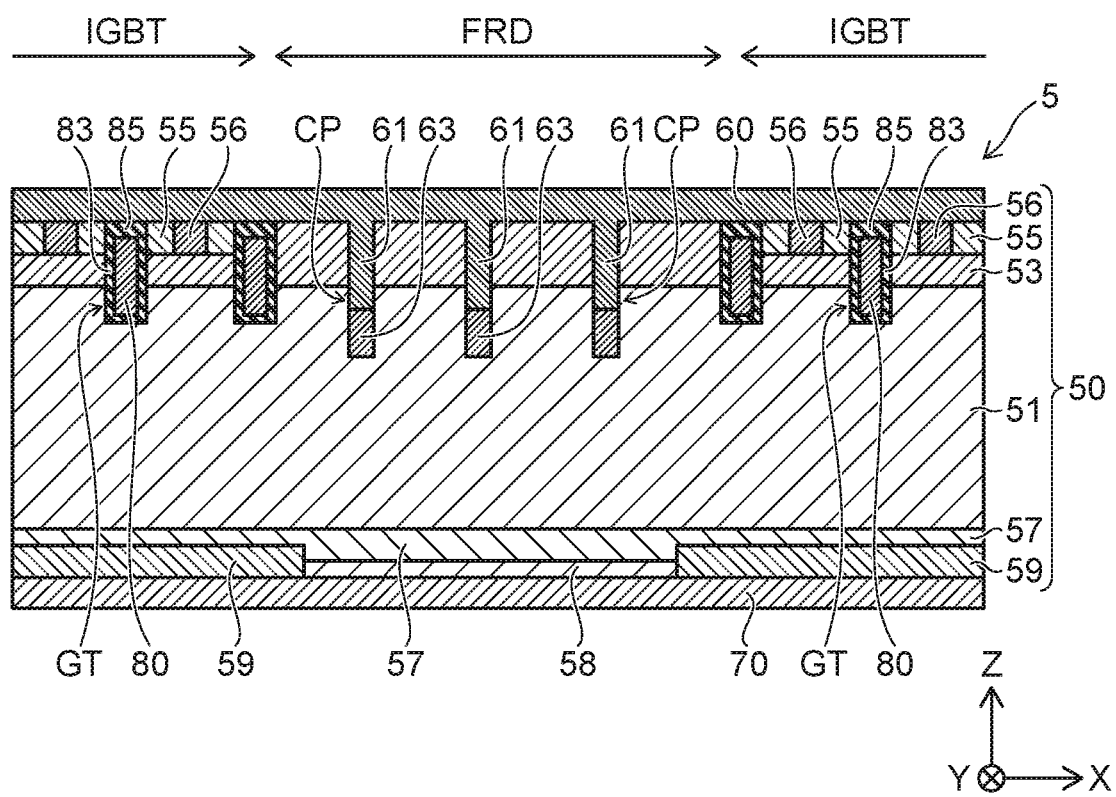
FIG. 10 is a schematic cross-sectional view showing a semiconductor device according to a third embodiment.

FIG. 10 is a schematic cross-sectional view showing a semiconductor device 5 according to a third embodiment. The semiconductor device 5 is, for example, an IGBT and includes a portion (an IGBT region) functioning as an IGBT and a portion (a FRD region) functioning as a FRD (Fast Recovery Diode).

As shown in FIG. 10, the semiconductor device 5 includes a semiconductor body 50, an emitter electrode 60, a collector electrode 70, and a gate electrode 80. The semiconductor body 50 is provided between the emitter electrode 60 and the collector electrode 70. The gate electrode 80 is disposed in the IGBT region and is provided in, for example, the interior of a gate trench GT provided in the front surface of the semiconductor body 50 on the emitter electrode 60 side. For example, the gate electrodes 80 are multiply provided and are arranged along the front surface of the semiconductor body 50.

Also, for example, the gate electrode 80 may be configured to include multiple portions arranged along the front surface of the semiconductor body 50. In other words, the gate electrode 80 may be an electrode having one body connected at not-illustrated portions.

The semiconductor body 50 includes an n-type base layer 51, a p-type base layer 53, an n-type emitter layer 55, a p-type contact layer 56, an n-type buffer layer 57, and a p-type collector layer 59.

The p-type base layer 53 is provided between the n-type base layer 51 and the emitter electrode 60. The n-type emitter layer 55 is selectively provided between the p-type base layer 53 and the emitter electrode 60. The p-type contact layer 56 is selectively provided between the p-type base layer 53 and the emitter electrode 60. The n-type emitter layer 55 and the p-type contact layer 56 are arranged along the front surface of the semiconductor body 50.

The n-type emitter layer 55 and the p-type contact layer 56 are disposed in the IGBT region and are provided between the gate electrodes 80 adjacent to each other in a direction along the front surface of the semiconductor body 50, The p-type contact layer 56 includes the p-type impurity having a higher concentration than the p-type impurity of the p-type base layer 53.

The emitter electrode 60 covers the front surface of the semiconductor body 50 and contacts the n-type emitter layer 55 and the p-type contact layer 56. The emitter electrode 60 is electrically connected to the p-type base layer 53 via the p-type contact layer 56.

The gate electrode 80 is disposed to oppose the n-type base layer 51, the p-type base layer 53, and the n-type emitter layer 55 with a gate insulating film 83 interposed. Also, the gate electrode 80 is electrically insulated from the emitter electrode 60 by an inter-layer insulating film 85.

The emitter electrode 60 includes an extension portion 61 provided in the FRD region. The extension portion 61 pierces the p-type base layer 53 and extends in a direction (the −Z direction) toward the collector electrode 70.

The semiconductor body 50 further includes a p-type semiconductor layer 63 provided inside the n-type base layer 51. The p-type semiconductor layer 63 is disposed at a position separated from the p-type base layer 53 in the FRD region.

The extension portion 61 of the emitter electrode 60 is provided to be connected to the p-type semiconductor layer 63. The extension portion 61 includes the contact portion CP contacting the n-type base layer 51 between the p-type base layer 53 and the p-type semiconductor layer 63. The extension portion 61 includes a material in the contact portion CP that has a Schottky contact with the n-type base layer 51.

The n-type buffer layer 57 is provided between the n-type base layer 51 and the collector electrode 70. The n-type buffer layer 57 includes the n-type impurity having a higher concentration than the n-type impurity of the n-type base layer 51. For example, the n-type buffer layer 57 is provided to contact the collector electrode 70 in the FRD region. Also, an $n^+$-type contact layer 58 may be provided between the n-type buffer layer 57 and the collector electrode 70. The $n^+$-type contact layer 58 includes the n-type impurity having a higher concentration than the n-type impurity of the n-type buffer layer 57 and is electrically connected to the collector electrode 70.

The p-type collector layer 59 is provided between the n-type buffer layer 57 and the collector electrode 70 in the IGBT region. The p-type collector layer 59 includes the p-type impurity having a higher concentration than the p-type impurity of the p-type base layer 53. For example, the p-type collector layer 59 is provided to contact the collector electrode 70.

In the semiconductor device 5 according to the embodiment, in the transition interval of the FR© portion switching from the ON-state to the OFF-state, the holes inside the n-type base layer 51 can be discharged to the emitter electrode 60 through the p-type semiconductor layer 63 and the extension portion 61. Thereby, the switching loss of the semiconductor device 5 can be reduced.

Although an IGBT that includes the structure shown in FIG. 1 is described as an example herein, the embodiments are not limited thereto. For example, the structures shown in FIG. 4, FIG. 6, and FIGS. 7A and 7B also are applicable; and combinations with a MOSFET are possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode disposed at a position opposing the first electrode; and
a semiconductor body provided between the first electrode and the second electrode, the semiconductor body including a first semiconductor layer of a first conductivity type,
the semiconductor body further including a second semiconductor layer of a second conductivity type and a third semiconductor layer of the second conductivity type, the second semiconductor layer being provided between the first semiconductor layer and the first electrode, the third semiconductor layer being selectively provided inside the first semiconductor layer and disposed at a position separated from the second semiconductor layer,
the first electrode being electrically connected to the second semiconductor layer and including an extension portion, the extension portion piercing the second semiconductor layer, extending in a first direction toward the second electrode, and being connected to the third semiconductor layer, wherein
the extension portion of the first electrode includes a first portion and a second portion, the first portion being positioned inside the third semiconductor layer, the second portion contacting the first semiconductor layer,
the first portion includes a first metal, and
the second portion includes a second metal having a larger work function than the first metal.

2. The device according to claim 1, wherein the first electrode contacts the second semiconductor layer and is electrically connected to the second semiconductor layer.

3. The device according to claim 1, wherein the extension portion has a Schottky contact with the first semiconductor layer at a portion positioned between the second semiconductor layer and the third semiconductor layer.

4. The device according to claim 1, wherein the semiconductor body further includes a fourth semiconductor layer provided between the first semiconductor layer and the second electrode, the fourth semiconductor layer being of the first conductivity type and including a first-conductivity-type impurity having a higher concentration than a first-conductivity-type impurity of the first semiconductor layer.

5. The device according to claim 3, wherein the second electrode contacts the fourth semiconductor layer and is electrically connected to the fourth semiconductor layer.

6. The device according to claim 1, wherein the second portion has a Schottky contact with the first semiconductor layer.

* * * * *